US012796278B2

(12) United States Patent
Park et al.

(10) Patent No.: US 12,796,278 B2
(45) Date of Patent: Nov. 10, 2026

(54) DISPLAY DEVICE

(71) Applicant: Samsung Display Co., Ltd., Yongin-si (KR)

(72) Inventors: Yonghwan Park, Yongin-si (KR); Gyungmin Ko, Yongin-si (KR); Sanghyun Jun, Yongin-si (KR); Yejoo Jun, Yongin-si (KR); Donghee Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 281 days.

(21) Appl. No.: 18/396,558

(22) Filed: Dec. 26, 2023

(65) Prior Publication Data

US 2024/0224699 A1 Jul. 4, 2024

(30) Foreign Application Priority Data

Dec. 29, 2022 (KR) ........................ 10-2022-0189743

(51) Int. Cl.
*H10K 59/40* (2023.01)
*H10K 59/35* (2023.01)

(52) U.S. Cl.
CPC ........... *H10K 59/40* (2023.02); *H10K 59/352* (2023.02); *H10K 59/353* (2023.02)

(58) Field of Classification Search
None
See application file for complete search history.

(56) References Cited

U.S. PATENT DOCUMENTS

2021/0083036 A1* 3/2021 Kang ..................... H10K 50/86
2021/0208710 A1* 7/2021 Han ..................... H10K 59/873
(Continued)

FOREIGN PATENT DOCUMENTS

JP 2016-136438 7/2016
KR 2019-0081756 7/2019
(Continued)

OTHER PUBLICATIONS

U.S. Appl. No. 11/455,067 B2 filed Sep. 27, 2022, Park.
(Continued)

*Primary Examiner* — Bo B Jang
(74) *Attorney, Agent, or Firm* — Womble Bond Dickinson (US) LLP

(57) ABSTRACT

A display device includes an array of sub-pixels including red, green, and blue sub-pixels, and an input sensing layer including a metal pattern at least partially surrounding each of the sub-pixels in a plan view. The array has a structure in which an $i^{th}$ column (where i is a natural number), in which the red sub-pixels and the green sub-pixels are alternately arranged, and an $(i+1)^{th}$ column, in which the blue sub-pixels are arranged, are alternately arranged. The metal pattern includes a first metal pattern partially surrounding a first sub-pixel, which is one of the sub-pixels, and a second metal pattern completely surrounding a second sub-pixel emitting light of a same color as the first sub-pixel. The first metal pattern includes a first open portion extending from the first sub-pixel in a first direction and a second open portion extending from the first sub-pixel in a second direction.

18 Claims, 14 Drawing Sheets

(56) References Cited

U.S. PATENT DOCUMENTS

| | | | |
|---|---|---|---|
| 2022/0404934 | A1 | 12/2022 | Park |
| 2023/0376076 | A1 | 11/2023 | Kusunoki et al. |

FOREIGN PATENT DOCUMENTS

| | | |
|---|---|---|
| KR | 2021-0085912 | 7/2021 |
| KR | 10-2022-0058514 A | 5/2022 |

OTHER PUBLICATIONS

U.S. Appl. No. 10/394,395 B2, filed Aug. 27, 2019, Nishioka, et al.
U.S. Appl. No. 11/604,545 B2, filed Mar. 14, 2023, Han, et al.

* cited by examiner

DISPLAY DEVICE

CROSS-REFERENCE TO RELATED APPLICATION

The present application claims priority to and the benefit of Korean Patent Application No. 10-2022-0189743, filed on Dec. 29, 2022, in the Korean Intellectual Property Office, the entire disclosure of which is incorporated herein by reference.

BACKGROUND

1. Field

Aspects of one or more embodiments relate to a display device.

2. Description of the Related Art

As display devices that display electrical signals visually have developed, various display devices having excellent characteristics such as relatively reduced thickness, weight, and power consumption have been introduced. Recently, relatively thinner display devices have been manufactured by depositing an input sensing layer.

The above information disclosed in this Background section is only for enhancement of understanding of the background and therefore the information discussed in this Background section does not necessarily constitute prior art.

SUMMARY

In order to increase input sensitivity, an input sensing layer may include a metal pattern. The metal pattern may be undesirably perceived by users according to a degree of patterning of the metal pattern. One or more embodiments may include a display device in which an element (e.g., a metal pattern) constituting the display device may not be undesirably perceived by users due to the reflection of external light. The above characteristics are merely examples, and the characteristics of embodiments according to the present disclosure are not limited to the characteristics described above.

Additional aspects will be set forth in part in the description which follows and, in part, will be apparent from the description, or may be learned by practice of the presented embodiments of the disclosure.

According to one or more embodiments, a display device includes light-emitting diodes, an encapsulation layer on the light-emitting diodes, and an input sensing layer on the encapsulation layer, the input sensing layer including a metal pattern at least partially surrounding each of the light-emitting diodes in a plan view, wherein a first metal pattern partially surrounding an emission area of a first light-emitting diode emitting light of a first color among the light-emitting diodes includes a first side portion adjacent to a first side of the emission area of the first light-emitting diode, the first side portion including a first open portion extending from the first side in a first direction, a second side portion adjacent to a second side of the emission area of the first light-emitting diode, the second side portion including a second open portion extending from the second side of the first light-emitting diode in a second direction crossing the first direction, and corner portions on both sides of the first side portion with the first open portion therebetween, a second metal pattern completely surrounding an emission area of a second light-emitting diode emitting light of the first color among the light-emitting diodes includes a first side portion adjacent to a first side of the emission area of the second light-emitting diode, a second side portion adjacent to a second side of the emission area of the second light-emitting diode, a third side portion on an opposite side of the first side of the emission area of the second light-emitting diode with the emission area of the second light-emitting diode therebetween, and corner portions on both sides of the first side portion of the second metal pattern or on both sides of the second side portion of the second metal pattern, and an effective length of an inner edge of the first side portion of the first metal pattern excluding the first open portion is substantially equal to an effective length of an inner edge of the first side portion of the second metal pattern or an effective length of an inner edge of the third side portion.

According to some embodiments, a length of an inner edge of each of the corner portions of the first metal pattern may be different from a length of an inner edge of each of the corner portions of the second metal pattern.

According to some embodiments, the inner edge of each of the corner portions of the first metal pattern and the inner edge of each of the corner portions of the second metal pattern may have a round shape in a plan view.

According to some embodiments, a radius of curvature of the inner edge of each of the corner portions of the first metal pattern may be less than a radius of curvature of the inner edge of each of the corner portions of the second metal pattern.

According to some embodiments, the inner edge of each of the corner portions of the first metal pattern and the inner edge of each of the corner portions of the second metal pattern may have a chamfered shape in a plan view.

According to some embodiments, the metal pattern may include at least one selected from molybdenum (Mo), mendelevium (Mb), silver (Ag), titanium (Ti), copper (Cu), and aluminum (Al).

According to some embodiments, a length of the first open portion may be substantially equal to a length of the second open portion.

According to some embodiments, a third metal pattern partially surrounding a third light-emitting diode which is adjacent to the first light-emitting diode and emits light of a color different from the first color may include a first side portion adjacent to a first side of an emission area of the third light-emitting diode, a second side portion adjacent to a second side of the emission area of the third light-emitting diode, a third side portion on an opposite side of the first side portion of the third metal pattern with the emission area of the third light-emitting diode therebetween, and a fourth side portion on an opposite side of the second side portion of the third metal pattern with the emission area of the third light-emitting diode therebetween, the fourth side portion of the third metal pattern may be the second side portion of the first metal pattern, and the second side portion of the third metal pattern and one of the first side portion and the third side portion of the third metal pattern may each include an open portion.

According to some embodiments, a length of the open portion may be equal (or substantially equal) to a length of the first open portion or the second open portion.

According to one or more embodiments, a display device includes an array of sub-pixels including red sub-pixels, green sub-pixels, and blue sub-pixels, and an input sensing layer including a metal pattern at least partially surrounding each of the sub-pixels in a plan view, wherein the array has a structure in which an $i^{th}$ column (where i is a natural number), in which the red sub-pixels and the green sub-pixels are alternately arranged, and an $(i+1)^{th}$ column, in which the blue sub-pixels are arranged, are alternately arranged, the metal pattern includes a first metal pattern partially surrounding a first sub-pixel, which is one of the sub-pixels, and a second metal pattern completely surrounding a second sub-pixel emitting light of a same color as the first sub-pixel, and the first metal pattern includes a first open portion extending from the first sub-pixel in a first direction and a second open portion extending from the first sub-pixel in a second direction crossing the first direction.

According to some embodiments, a length of the first open portion may be substantially equal to a length of the second open portion.

According to some embodiments, the first metal pattern may include a first side portion adjacent to a first side of the first sub-pixel, the first side portion including a first open portion, a second side portion adjacent to a second side of the first sub-pixel, the second side portion including a second open portion, and corner portions on both sides of the first side portion with the first open portion therebetween, the second metal pattern may include a first side portion adjacent to a first side of the second sub-pixel, a second side portion adjacent to a second side of the second sub-pixel; a third side portion on an opposite side of the first side of the second metal pattern with the second sub-pixel therebetween, and corner portions on both sides of the first side portion of the second metal pattern or on both sides of the second side portion of the second metal pattern.

According to some embodiments, an effective length of an inner edge of the first side portion of the first metal pattern excluding the first open portion may be substantially equal to an effective length of an inner edge of the first side portion of the second metal pattern or an effective length of an inner edge of the third side portion.

According to some embodiments, a length of an inner edge of each of the corner portions of the first metal pattern may be different from a length of an inner edge of each of the corner portions of the second metal pattern.

According to some embodiments, the inner edge of each of the corner portions of the first metal pattern and the inner edge of each of the corner portions of the second metal pattern may have a round shape in a plan view.

According to some embodiments, a radius of curvature of the inner edge of each of the corner portions of the first metal pattern may be less than a radius of curvature of the inner edge of each of the corner portions of the second metal pattern.

According to some embodiments, the inner edge of each of the corner portions of the first metal pattern and the inner edge of each of the corner portions of the second metal pattern may have a chamfered shape in a plan view.

According to some embodiments, a third metal pattern partially surrounding a third sub-pixel which is adjacent to the first sub-pixel and emits light of a color different from the first sub-pixel may include a first side portion adjacent to a first side of the third sub-pixel, a second side portion adjacent to a second side of the third sub-pixel, a third side portion on an opposite side of the first side portion of the third metal pattern with the third sub-pixel therebetween, and a fourth side portion on an opposite side of the second side portion of the third metal pattern with the third sub-pixel therebetween, the fourth side portion of the third metal pattern may be the second side portion of the first metal pattern, and the second side portion of the third metal pattern and one of the first side portion and the third side portion of the third metal pattern may each include an open portion.

According to some embodiments, a length of the open portion may be substantially equal to a length of the first open portion or the second open portion.

According to some embodiments, the metal pattern may include at least one selected from molybdenum (Mo), mendelevium (Mb), silver (Ag), titanium (Ti), copper (Cu), and aluminum (Al).

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
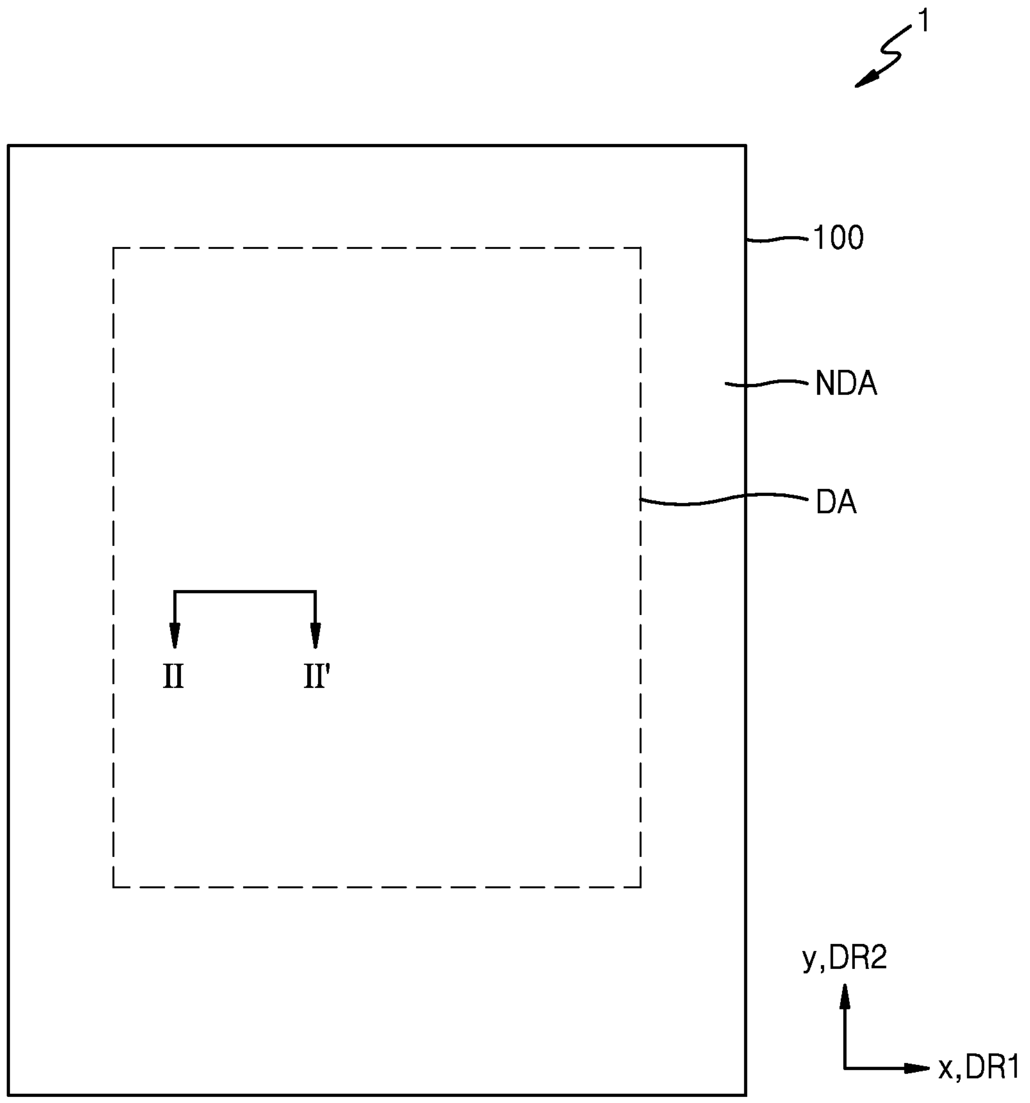
FIG. 1 is a plan view schematically illustrating a display device according to some embodiments.

Reference will now be made in more detail to aspects of some embodiments, examples of which are illustrated in the accompanying drawings, wherein like reference numerals refer to like elements throughout. In this regard, the embodiments according to the present disclosure may have different forms and should not be construed as being limited to the descriptions set forth herein. Accordingly, aspects of some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, embodiments according to the present disclosure are not limited to the specific description that follows and may be embodied in various forms.

Hereinafter, aspects of some embodiments will be described in more detail with reference to the accompanying drawings. When describing the embodiments with reference to the accompanying drawings, the same or corresponding elements are denoted by the same reference numerals, and redundant descriptions thereof will be omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, embodiments according to the present disclosure are not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

FIG. 1 is a plan view schematically illustrating a display device 1 according to some embodiments.

Referring to FIG. 1, the display device 1 may include a display area DA and a non-display area NDA. Sub-pixels each including a display element, such as a light-emitting diode, may be arranged in the display area DA and may display images based on data signals. The non-display area NDA is an area that does not display images, and may surround the display area DA. That is, the non-display area NDA may be in a periphery or outside a footprint of the display area DA. A scan driver and a data driver configured to provide electrical signals to be applied to the sub-pixels of the display area DA and power lines configured to provide electric power, such as a driving voltage and a common voltage, may be arranged in the non-display area NDA.

FIG. 1 illustrates that the length of the display device 1 in a first direction DR1 (e.g., ±x directions) is less than the length of the display device 1 in a second direction DR2 (e.g., ty directions) crossing the first direction DR1 (e.g., +x directions), but embodiments according to the present disclosure are not limited thereto. The shape of the display device 1 may be variously changed. For example, the length of the display device 1 in the first direction DR1 (e.g., +x directions) may be greater than the length of the display device 1 in the second direction DR2 (e.g., ty directions).

The display device 1 may be used in various products, such as mobile phones, smartphones, tablet personal computers (PCs), mobile communication terminals, electronic organizers, e-books, portable multimedia players (PMPs), navigations, ultra mobile PCs (UMPCs), televisions, laptops, monitors, billboards, and Internet of things (IOT) devices. The display device 1 according to some embodiments may also be applied to wearable devices, such as smart watches, watch phones, glasses-type displays, and head mounted displays (HMDs). The display device 1 according to some embodiments may also be used in dashboards of automobiles, center information displays (CIDs) on the center fascia or dashboards of automobiles, room mirror displays replacing side mirrors of automobiles, and electronic devices on the rear sides of front seats to serve as entertainment devices for backseat passengers of automobiles.

Figure 2:
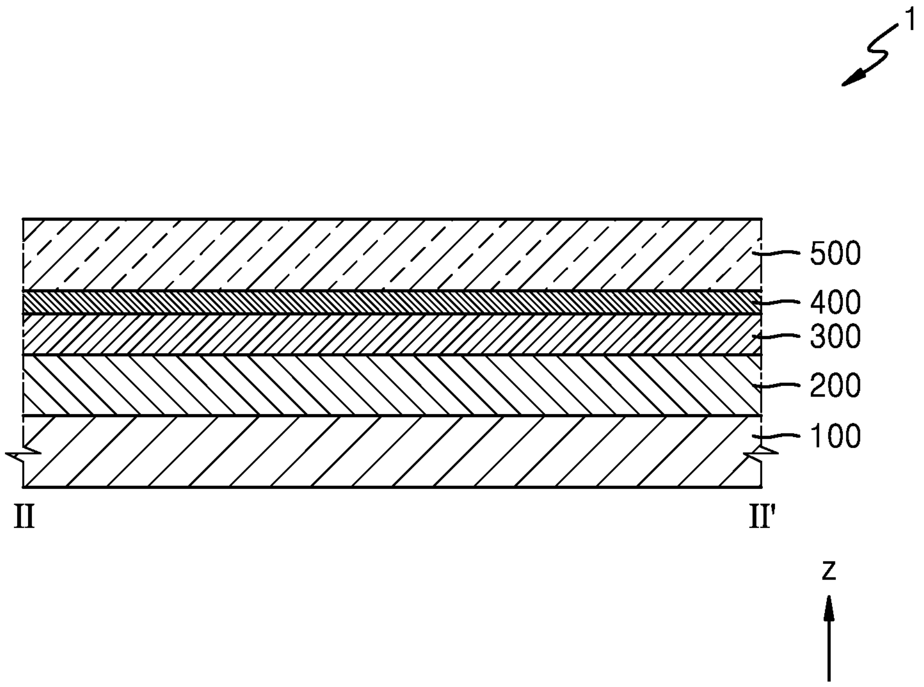
FIG. 2 is a cross-sectional view of the display device taken along the line II-II' of FIG. 1 according to some embodiments.

FIG. 2 is a cross-sectional view of the display device 1 taken along the line II-II' of FIG. 1.

Referring to FIG. 2, the display device 1 may include a display element layer 200 defining the display area DA on a substrate 100. The substrate 100 may include various materials, such as a glass material, a metal material, or a plastic material (e.g., polyethylene terephthalate (PET), polyethylene naphthalate (PEN), or polyimide). The display element layer 200 may include sub-pixels each including an organic light-emitting element and may provide a certain image. The display element layer 200 may be covered with an encapsulation layer 300.

The encapsulation layer 300 may be arranged to face the substrate 100 with the display element layer 200 therebetween and may protect the display element layer 200 from ambient moisture or oxygen or other contaminants. An input sensing layer 400 may be located on the encapsulation layer 300.

The input sensing layer 400 may include a plurality of touch electrodes having conductivity. For example, the input sensing layer 400 may be a capacitive input sensing layer. The input sensing layer 400 may be used to output coordinates of a location where an object, such as a user's hand or a stylus (or the like), approaches or touches by using a change in capacitance that occurs when the object approaches or touches the surface of the input sensing layer 400.

An optical functional layer 500 may be located on the input sensing layer 400. The optical functional layer 500 may include an anti-reflection layer. The anti-reflection layer may include a polarizer or a layer including a black matrix and a color filter. The optical functional layer 500 may include a window and/or an overcoat layer on the anti-reflection layer.

Figure 3:
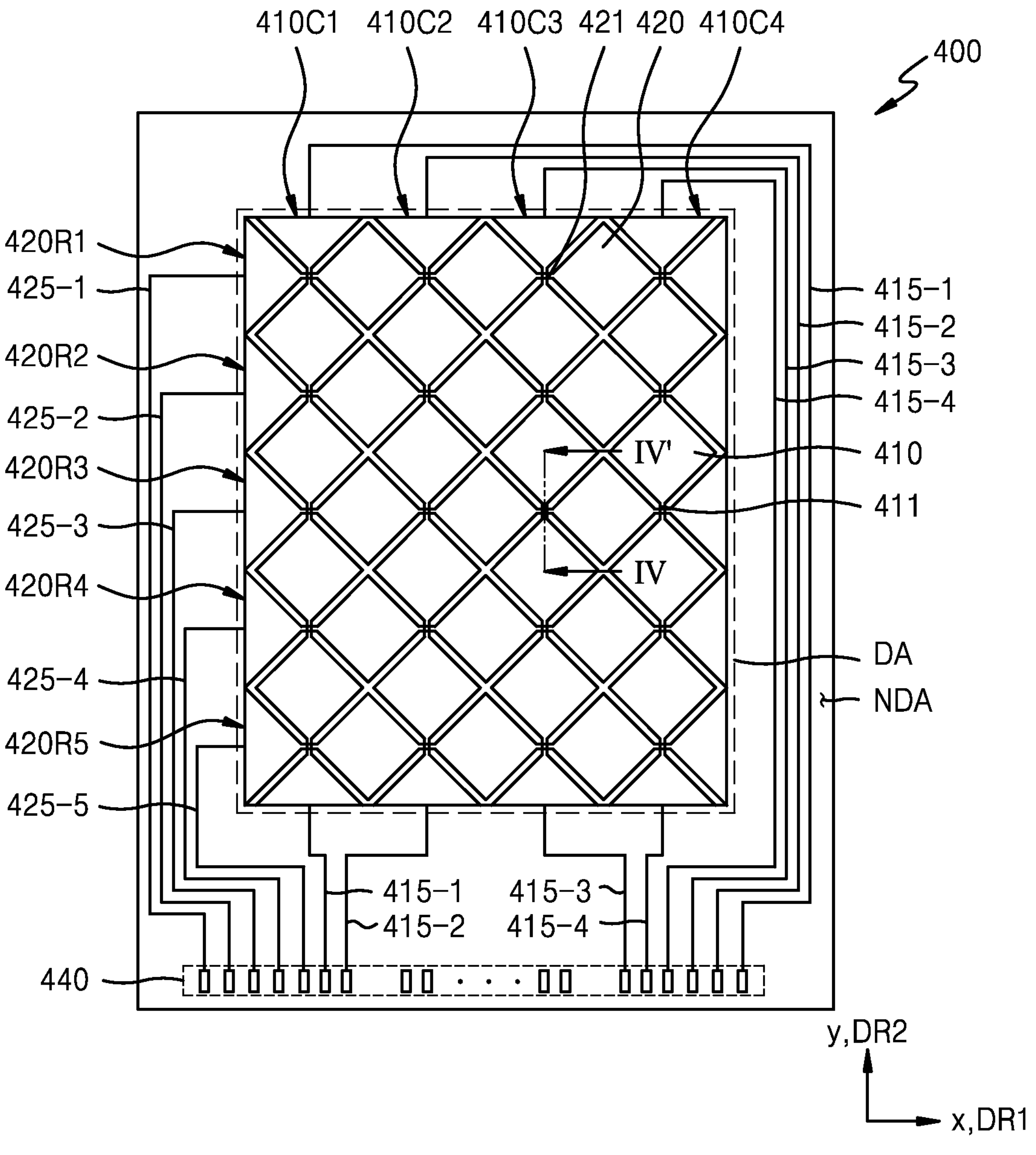
FIG. 3 is a plan view illustrating an input sensing layer of a display device, according to some embodiments.

FIG. 3 is a plan view illustrating the input sensing layer 400 of the display device 1, according to some embodiments.

Referring to FIG. 3, the input sensing layer 400 may include first sensing electrodes 410, first signal lines 415-1 to 415-4 connected to the first sensing electrodes 410, second sensing electrodes 420, and second signal lines 425-1 to 425-5 connected to the second sensing electrodes 420. The input sensing layer 400 may be configured to sense an external input by using a mutual capacitance method and/or a self-capacitance method. Consistent with some embodiments, FIG. 3 illustrates a mutual capacitance method or mechanism, but embodiments according to the present disclosure are not limited thereto.

For example, the first sensing electrodes 410 may be arranged in the second direction DR2 (e.g., ty directions), and the second sensing electrodes 420 may be arranged in the first direction DR1 (e.g., ±x directions). The first sensing electrodes 410 arranged in the second direction DR2 (e.g., ±y directions) may be connected to each other through first connection electrodes 411 between the first sensing electrodes 410 adjacent to each other and may form first sensing lines 410C1 to 410C4, respectively. The second sensing electrodes 420 arranged in the first direction DR1 (e.g., +x directions) may be connected to each other through second connection electrodes 421 between the second sensing electrodes 420 adjacent to each other and may form second sensing lines 420R1 to 420R5, respectively. The first sensing lines 410C1 to 410C4 and the second sensing lines 420R1 to 420R5 may cross each other. For example, the first sensing lines 410C1 to 410C4 and the second sensing lines 420R1 to 420R5 may cross each other vertically.

The first sensing lines 410C1 to 410C4 and the second sensing lines 420R1 to 420R5 are arranged in the display area DA, and may be connected to a sensing signal pad 440 through the first and second signal lines 415-1 to 415-4 and 425-1 to 425-5 formed in the non-display area NDA. The first sensing lines 410C1 to 410C4 may be respectively connected to the first signal lines 415-1 to 415-4, and the second sensing lines 420R1 to 420R5 may be respectively connected to the second signal lines 425-1 to 425-5.

FIG. 3 illustrates that the first signal lines 415-1 to 415-4 are respectively connected to the upper and lower sides of the first sensing lines 410C1 to 410C4, and this structure may improve sensing sensitivity. However, embodiments according to the present disclosure are not limited thereto. According to some embodiments, the first signal lines 415-1 to 415-4 may be connected only to upper or lower sides of the first sensing lines 410C1 to 410C4.

Although FIG. 3 illustrates that the upper first signal lines 415-1 to 415-4 and the lower first signal lines 415-1 to 415-4 are connected to the sensing signal pad 440, embodiments according to the present disclosure are not limited thereto. According to some embodiments, the upper first signal lines 415-1 to 415-4 and the lower first signal lines 415-1 to 415-4 may be electrically connected in the non-display area NDA and connected to the sensing signal pad 440.

Figure 4:
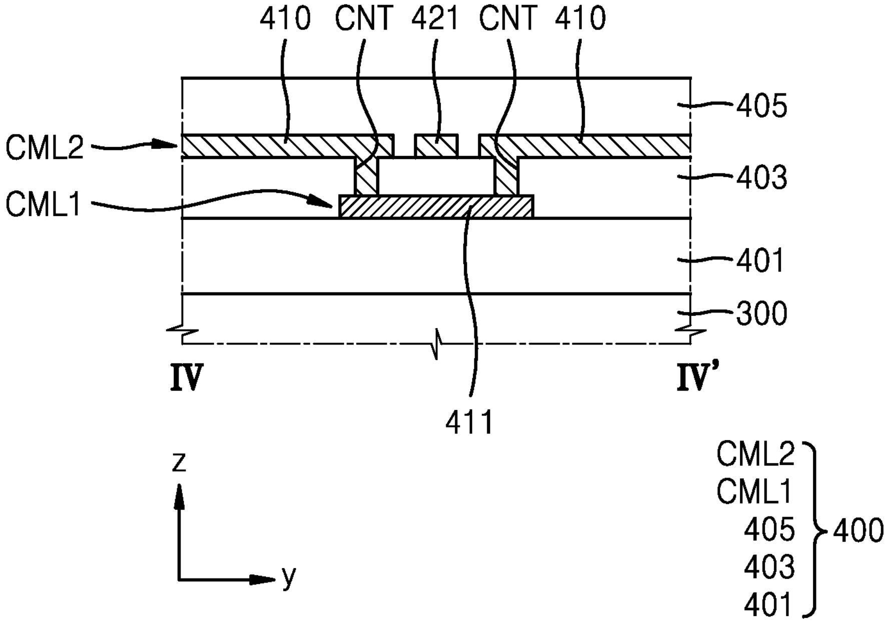
FIG. 4 is a schematic cross-sectional view of the input sensing layer of the display device taken along the line IV-IV' of FIG. 3, according to some embodiments.

FIG. 4 is a schematic cross-sectional view of the input sensing layer 400 of the display device 1 taken along the line IV-IV' of FIG. 3, according to some embodiments.

Referring to FIG. 4, the input sensing layer 400 may include a first conductive pattern layer CML1 and a second conductive pattern layer CML2 on the encapsulation layer 300. A first insulating layer 401 may be between the encapsulation layer 300 and the first conductive pattern layer CML1. That is, a first insulating layer 401 may be located on the encapsulation layer 300, and the first conductive pattern layer CML1 may be located or formed on the first insulating layer 401. A second insulating layer 403 may be between the first conductive pattern layer CML1 and the second conductive pattern layer CML2. That is, a second insulating layer 403 may be located or formed over the first conductive pattern layer CML1 and the first insulating layer 401. A third insulating layer 405 may be located on the second conductive pattern layer CML2.

The first conductive pattern layer CML1 and the second conductive pattern layer CML2 may each include a conductive metal or conductive material. For example, the first conductive pattern layer CML1 and the second conductive pattern layer CML2 may each include at least one selected from molybdenum (Mo), mendelevium (Mb), silver (Ag), titanium (Ti), copper (Cu), and aluminum (Al).

The first conductive pattern layer CML1 and the second conductive pattern layer CML2 may each have a single-layer or multilayer structure including the conductive metal or a conductive material described above. The first conductive pattern layer CML1 and the second conductive pattern layer CML2 may each include multi-layered sub-metal layers. For example, the first conductive pattern layer CML1 and the second conductive pattern layer CML2 may each include a structure in which titanium/aluminum/titanium sub-metal layers are stacked.

The first insulating layer 401, the second insulating layer 403, and the third insulating layer 405 may each include an inorganic insulating material (e.g., silicon oxide, silicon nitride, and/or silicon oxynitride) or an organic insulating material. According to some embodiments, the first insulating layer 401 and the second insulating layer 403 may each include an inorganic insulating material, and the third insulating layer 405 may include an organic insulating material.

Some of the first and second sensing electrodes 410 and 420 and the first and second connection electrodes 411 and 421 described above with reference to FIG. 3 may be located in the first conductive pattern layer CML1, and the others thereof may be located in the second conductive pattern layer CML2. For example, as illustrated in FIG. 4, the first conductive pattern layer CML1 may include the first connection electrode 411, and the second conductive pattern layer CML2 may include the first and second sensing electrodes 410 and 420 (FIGS. 3 and 4) and the second connection electrode 421. The second sensing electrodes 420 adjacent to each other may be electrically connected to each other through the second connection electrode 421 located on the same layer. The first sensing electrodes 410 adjacent to each other may be electrically connected to each other through the first connection electrode 411, and may be connected to the first connection electrode 411 through a contact hole CNT passing through the second insulating layer 403. That is one or more vias may be formed through the second insulating layer 403 to electrically connect the first sensing electrodes 410 to the first connection electrode 411.

Figure 5:
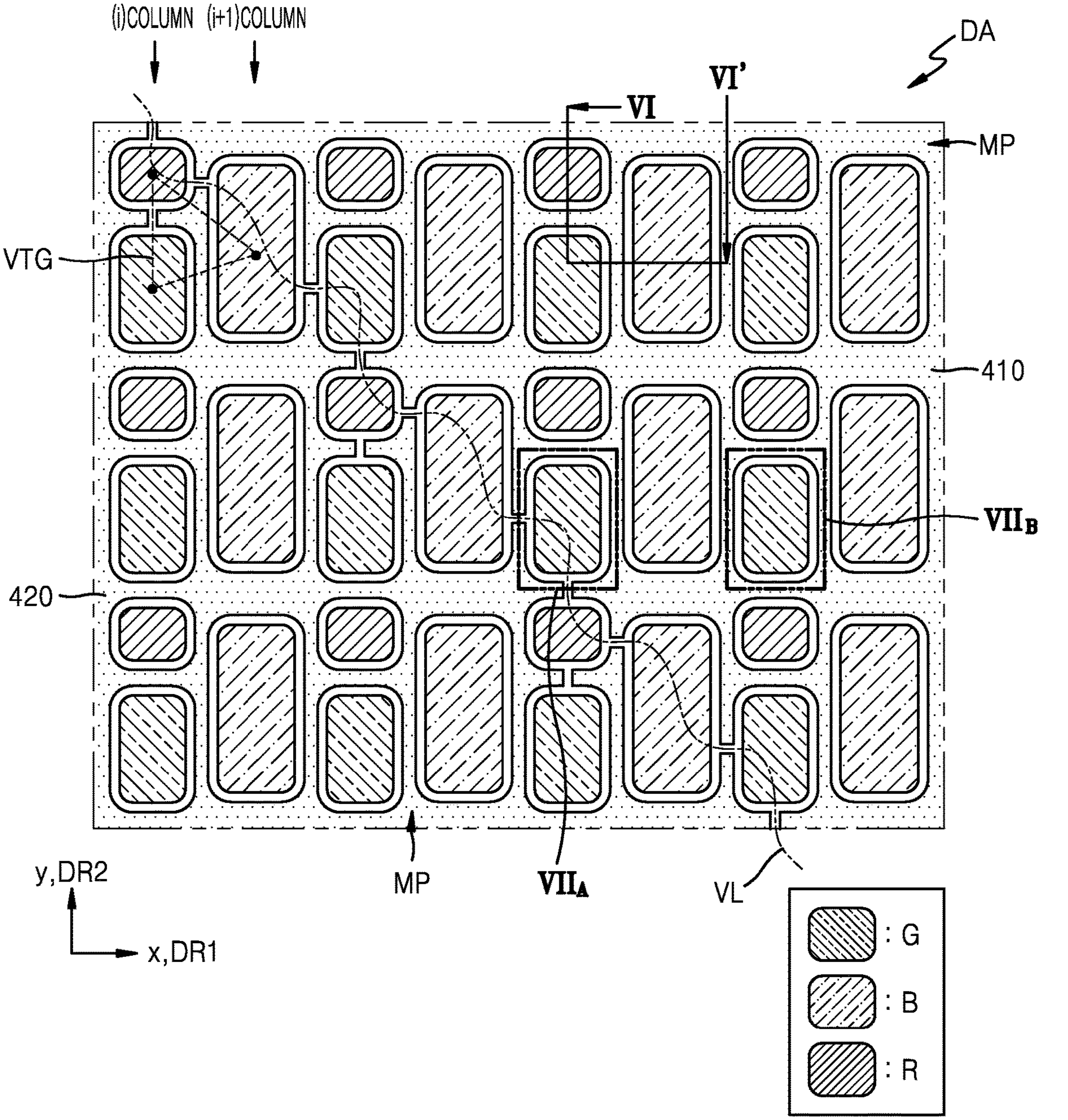
FIG. 5 is an enlarged plan view illustrating a portion of a display area of a display device, according to some embodiments.

FIG. 5 is an enlarged plan view illustrating a portion of the display area DA of the display device 1, according to some embodiments.

Referring to FIG. 5, the sub-pixels may be two-dimensionally arranged in the display area DA in the first direction DR1 (e.g., +x directions) and the second direction DR2 (e.g., ty directions). An array of sub-pixels, for example, an array of red sub-pixels R, green sub-pixels G, and blue sub-pixels B may define the display area DA.

According to some embodiments, the array of sub-pixels may include a plurality of columns (or pixel columns) arranged in the second direction DR2 (e.g., ty directions). Two sub-pixels emitting pieces of light of different colors among the sub-pixels, for example, the red sub-pixel R and the green sub-pixel G may be arranged in the same column, and the remaining sub-pixel, for example, the blue sub-pixel B may be arranged in another column. Red sub-pixels R and green sub-pixels G corresponding to an $i^{th}$ column (where i is a natural number) may be alternately arranged in a state of being spaced apart from each other in the second direction DR2 (e.g., ty directions). Blue sub-pixels B corresponding to an $(i+1)^{th}$ column may be spaced apart from each other. The array of sub-pixels may have a structure in which the $i^{th}$ column and the $(i+1)^{th}$ column are repeated in the first direction DR1 (e.g., +x directions).

According to some embodiments, the distances between the red sub-pixels R and the green sub-pixels G adjacent to each other in the same column (e.g., the $i^{th}$ column) may be equal (or substantially equal) to each other. The distances between the blue sub-pixels B adjacent to each other in the same column (e.g., the $(i+1)^{th}$ column) may also be equal (or substantially equal) to each other. According to some embodiments, a first distance between two blue sub-pixels B adjacent to each other in the same column (e.g., the $(i+1)^{th}$ column) may be different from a second distance between two other blue sub-pixels B adjacent to each other in the same column (e.g., the $(i+1)^{th}$ column).

The areas of the red sub-pixel R, the green sub-pixel G, and the blue sub-pixel B may be different from each other. For example, the area of the blue sub-pixel B may be greater than the area of the green sub-pixel G, and the area of the green sub-pixel G may be greater than the area of the red sub-pixel R. The red sub-pixel R, the green sub-pixel G, and the blue sub-pixel B adjacent to each other may each be located in a virtual triangle VTG. For example, the center of the red sub-pixel R, the center of the green sub-pixel G, and the center of the blue sub-pixel B may be located at vertices of the virtual triangle VTG. The virtual triangle VTG may be an acute triangle.

As illustrated in FIG. 5, the first conductive pattern layer CML1 and the second conductive pattern layer CML2 described above with reference to FIG. 4 may have a mesh-shaped metal pattern (or a substantially mesh-shaped metal pattern) MP that at least partially surrounds the respective sub-pixels.

According to some embodiments, as illustrated in FIG. 5, the metal pattern MP may include the first sensing electrode 410 and the second sensing electrode 420 separated from each other with respect to a virtual line VL. Some sub-pixels may be completely surrounded by the metal pattern MP, and other sub-pixels may be partially surrounded by the metal pattern MP. For example, the sub-pixels passing through the virtual line VL may be partially surrounded by the metal pattern MP, and the other sub-pixels may be completely surrounded by the metal pattern MP.

Figure 6:
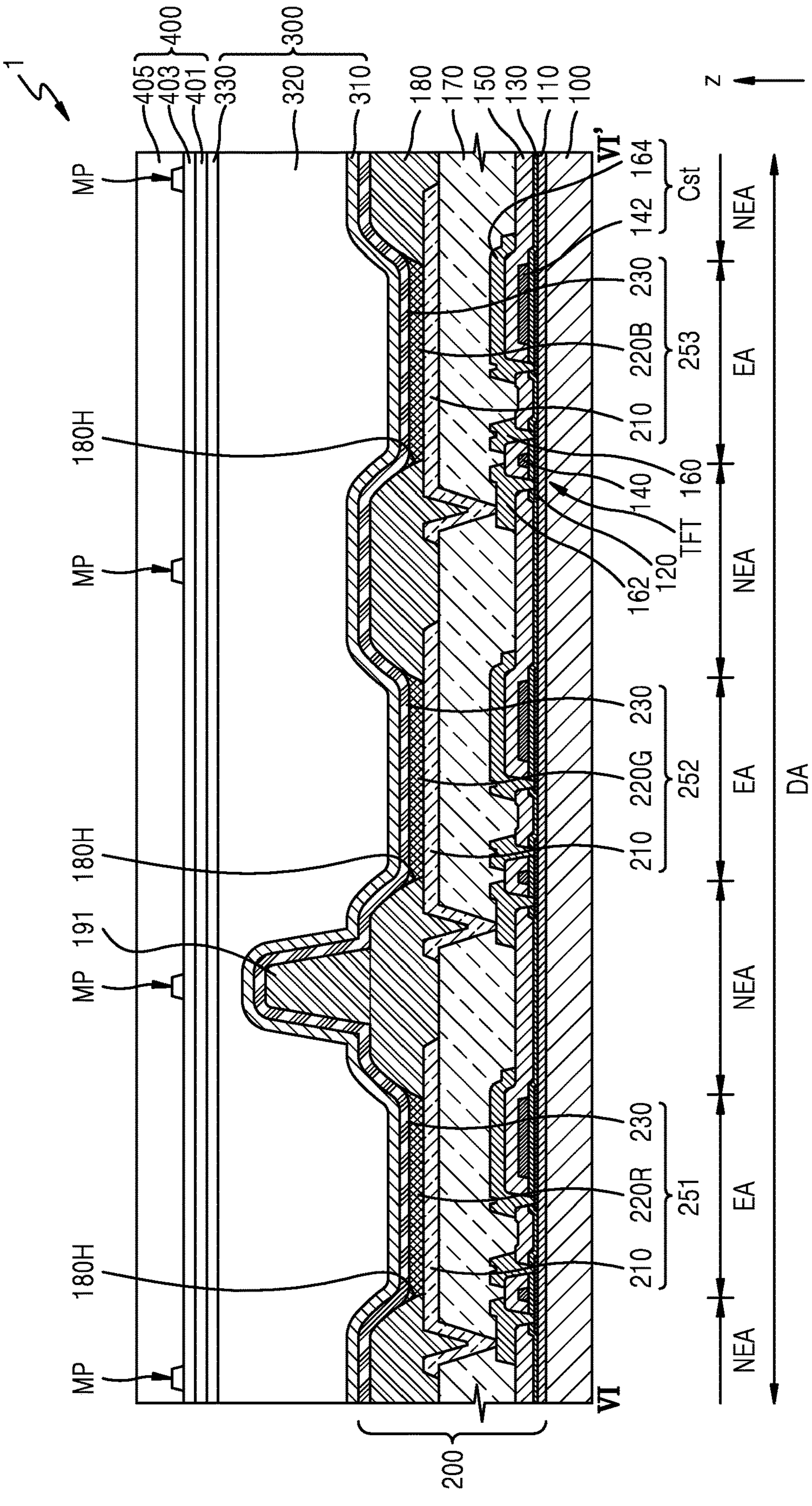
FIG. 6 is a cross-sectional view of a portion of the display device taken along the line VI-VI' of FIG. 5, according to some embodiments.

FIG. 6 is a cross-sectional view of a portion of the display device 1 taken along the line VI-VI' of FIG. 5, according to some embodiments. For convenience of description, FIG. 6 illustrates the display device 1 in which the optical functional layer 500 described above with reference to FIG. 2 may be omitted.

Referring to FIG. 6, a display element layer 200 may be located on a substrate 100. The display element layer 200 may include light-emitting diodes 251, 252, and 253 corresponding to sub-pixels arranged in a display area DA. The light-emitting diodes 251, 252, and 253 may each be electrically connected to a thin-film transistor TFT and a storage capacitor Cst.

The thin-film transistor TFT may include a semiconductor layer 120, a gate electrode 140 overlapping a partial region (channel region) of the semiconductor layer 120, and a source electrode 160 and a drain electrode 162 connected to the semiconductor layer 120. The semiconductor layer 120 may include an inorganic semiconductor, such as silicon (e.g., amorphous silicon, polysilicon, etc.), an organic semiconductor, or an oxide semiconductor material. The semiconductor layer 120 may have a source region, a drain region, and a channel region between the source region and the drain region. The gate electrode 140 may include at least one material selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may have a single-layer or multilayer structure including the material described above.

A buffer layer 110 may be between the semiconductor layer 120 and the substrate 100 so as to prevent or reduce infiltration of impurities or contaminants. A gate insulating layer 130 may be between the semiconductor layer 120 and the gate electrode 140. An interlayer insulating layer 150 may be located on the gate electrode 140. The buffer layer 110, the gate insulating layer 130, and the interlayer insulating layer 150 may each include an inorganic insulating material, such as silicon oxide, silicon nitride, silicon oxynitride, aluminum oxide, aluminum nitride, titanium oxide, or titanium nitride.

The source electrode 160 and the drain electrode 162 may be located on the interlayer insulating layer 150, and may be respectively connected to the source region and the drain region of the semiconductor layer 120. According to some embodiments, the source region, and the drain region of the semiconductor layer 120 may be understood as the source electrode and the drain electrode, respectively. The source electrode 160 and the drain electrode 162 may each include at least one selected from Al, Pt, Pd, Ag, Mg, Au, Ni, Nd, Ir, Cr, Li, Ca, Mo, Ti, W, and Cu, and may include a single layer or multiple layers including one or more of the materials described above. The storage capacitor Cst may include a lower electrode 142 and an upper electrode 164. The lower electrode 142 may include the same material as that of the gate electrode 140, and the upper electrode 164 may include the same material as that of the source electrode 160 or the drain electrode 162, but embodiments according to the present disclosure are not limited thereto.

The thin-film transistor TFT and the storage capacitor Cst may be covered with a planarization insulating layer 170. The planarization insulating layer 170 may include an organic insulating material selected from general-purpose polymer (polymethylmethacrylate (PMMA) or polystyrene (PS)), polymer derivatives having a phenolic group, acrylic polymer, imide-based polymer, aryl ether-based polymer, amide-based polymer, fluorine-based polymer, p-xylene-based polymer, vinyl alcohol-based polymer, and any blend thereof. Alternatively, the planarization insulating layer 170 may include both an inorganic insulating material and an organic insulating material.

The light-emitting diodes 251, 252, and 253 corresponding to the sub-pixels may be located on the planarization insulating layer 170. The light-emitting diodes 251, 252, and 253 may each be electrically connected to the thin-film transistor TFT through a contact hole defined in the planarization insulating layer 170. The light-emitting diodes 251, 252, and 253 may be light-emitting diodes configured to emit red light, blue light, and green light, respectively.

The red light-emitting diode 251 corresponding to the red sub-pixel may include a first electrode 210, an emission layer 220R configured to emit red light, and a second electrode 230. The green light-emitting diode 252 corresponding to the green sub-pixel may include a first electrode 210, an emission layer 220G configured to emit green light, and a second electrode 230. The blue light-emitting diode 253 corresponding to the blue sub-pixel may include a first electrode 210, an emission layer 220B configured to emit blue light, and a second electrode 230.

The first electrode 210 may be a reflective electrode. The first electrode 210 may include a reflective layer including Ag, Mg, Al, Pt, Pd, Au, Ni, Nd, Ir, Cr, or any compound thereof, and may further include a layer including indium tin oxide (ITO), indium zinc oxide (IZO), zinc oxide (ZnO), indium oxide ($In_2O_3$), or the like. For example, the first electrode 210 may be a triple layer of ITO/Ag/ITO.

A bank layer 180 may have an opening 180H exposing the central portion of the first electrode 210. The opening 180H may define an emission area EA of each of the light-emitting diodes located at the corresponding positions, for example, the red, green, and blue light-emitting diodes 251, 252, and 253. The emission area EA of the red light-emitting diode 251 may correspond to the red sub-pixel described above with reference to FIG. 5, the emission area EA of the green light-emitting diode 252 may correspond to the green sub-pixel described above with reference to FIG. 5, and the emission area EA of the blue light-emitting diode 253 may correspond to the blue sub-pixel described above with reference to FIG. 5.

The bank layer 180 may include an organic insulating material, such as polyimide (PI) or hexamethyldisiloxane (HMDSO). According to some embodiments, the bank layer 180 may include a light blocking material. For example, the bank layer 180 may include a PI-based binder and a pigment in which red, green, and blue colors are mixed. Alternatively, the bank layer 180 may include a cardo-based binder resin and a mixture of lactam black pigment and blue pigment. Alternatively, the bank layer 180 may include carbon black.

A spacer 191 may be located on the bank layer 180. For example, the spacer 191 may be located directly on the bank layer 180. The spacer 191 may be located in a non-emission area NEA between the emission areas EA. The spacer 191 may support a mask used in a process of depositing emission layers 220R, 220B, and 220G to be described below, so as to prevent, reduce, or minimize defects in the emission layers 220R, 220B, and 220G due to sagging of the mask. The spacer 191 may include an organic insulating material, such as PI or HMDSO.

The red emission layer 220R may include an organic material. For example, the red emission layer 220R may include a fluorescent material or a phosphorescent material configured to emit red visible light. The green emission layer 220G may include an organic material. The green emission layer 220G may include a fluorescent material or a phosphorescent material configured to emit green visible light. The blue emission layer 220B may include an organic material. The blue emission layer 220B may include a fluorescent material or a phosphorescent material configured to emit blue visible light.

The second electrode 230 may be a (semi)transparent electrode. The second electrode 230 may be a layer including Ag, Mg, Al, Yb, Ca, Li, Au, or any compound thereof, or may be a layer including a (semi)transparent material, such as ITO, IZO, ZnO, or $In_2O_3$. According to some embodiments, the second electrode 230 may include a metal thin-film including Ag and Mg.

Although FIG. 6 illustrates a structure in which the red, blue, and green emission layers 220R, 220B, and 220G are between the first electrode 210 and the second electrode 230 and come into direct contact with the first electrode 210 and the second electrode 230, embodiments according to the present disclosure are not limited thereto. According to some embodiments, a first functional layer may be located below the red, blue, and green emission layers 220R, 220B, and 220G, and a second functional layer may be located above the red, blue, and green emission layers 220R, 220B, and 220G. The first functional layer and/or the second functional layer may overlap the emission area EA and the non-emission area NEA, like the second electrode 230.

The first functional layer may be a single layer or layers including a hole injection layer (HIL) and/or a hole transport layer (HTL). The second functional layer may be a single layer or layers including an electron transport layer (ETL) and/or an electron injection layer (EIL).

An encapsulation layer 300 may include at least one inorganic encapsulation layer and at least one organic encapsulation layer. For example, the encapsulation layer 300 may include a first inorganic encapsulation layer 310, a second inorganic encapsulation layer 330, and an organic encapsulation layer 320 therebetween. The first inorganic encapsulation layer 310 and the second inorganic encapsulation layer 330 may each include an inorganic insulating material, such as silicon oxide, silicon nitride, or silicon oxynitride. The organic encapsulation layer 320 may include at least one organic material selected from polyethylene terephthalate, polyethylene naphthalate, polycarbonate, polyimide, polyethylene sulfonate, polyoxymethylene, polyarylate, and hexamethyldisiloxane.

An input sensing layer 400 may be located on the encapsulation layer 300. The input sensing layer 400 may include a metal pattern MP on a first insulating layer 401 and a second insulating layer 403. The metal pattern MP illustrated in FIG. 6 may correspond to the sensing electrode described above with reference to FIG. 5, for example, the first sensing electrode 410 of FIG. 5. A third insulating layer 405 may be located on the metal pattern MP.

Although FIG. 6 illustrates that the light-emitting diodes, for example, the red, green, and blue light-emitting diodes 251, 252, and 253 are each an organic light-emitting diode including an organic material, embodiments according to the present disclosure are not limited thereto. According to some embodiments, the red, green, and blue light-emitting diodes 251, 252, and 253 may each be an inorganic light-emitting diode including an inorganic material. The inorganic light-emitting diode may include a PN junction diode including inorganic semiconductor-based materials. When a voltage is applied to the PN junction diode in a forward direction, holes and electrons may be injected and recombined to generate energy, and the energy may be converted into light energy to emit light of a certain color. The inorganic light-emitting diode may have a length and/or a width of several to several hundred micrometers, or several to several hundred nanometers.

According to some embodiments, the red, green, and blue light-emitting diodes 251, 252, and 253 may each include a quantum dot light-emitting diode including quantum dots. As described above, the emission layers of the red, green, and blue light-emitting diodes 251, 252, and 253 may each include an organic material, an inorganic materials, or quantum dots, may each include an organic material and quantum dots, or may each include an inorganic material and quantum dots. The red, green, and blue light-emitting diodes 251, 252, and 253 may each have a bar or rod shape. Alternatively, the red, green, and blue light-emitting diodes 251, 252, and 253 may each have various shapes. For example, the red, green, and blue light-emitting diodes 251, 252, and 253 may each have a polygonal planar shape, an elliptical planar shape, or a circular planar shape having a certain area.

Figure 7:
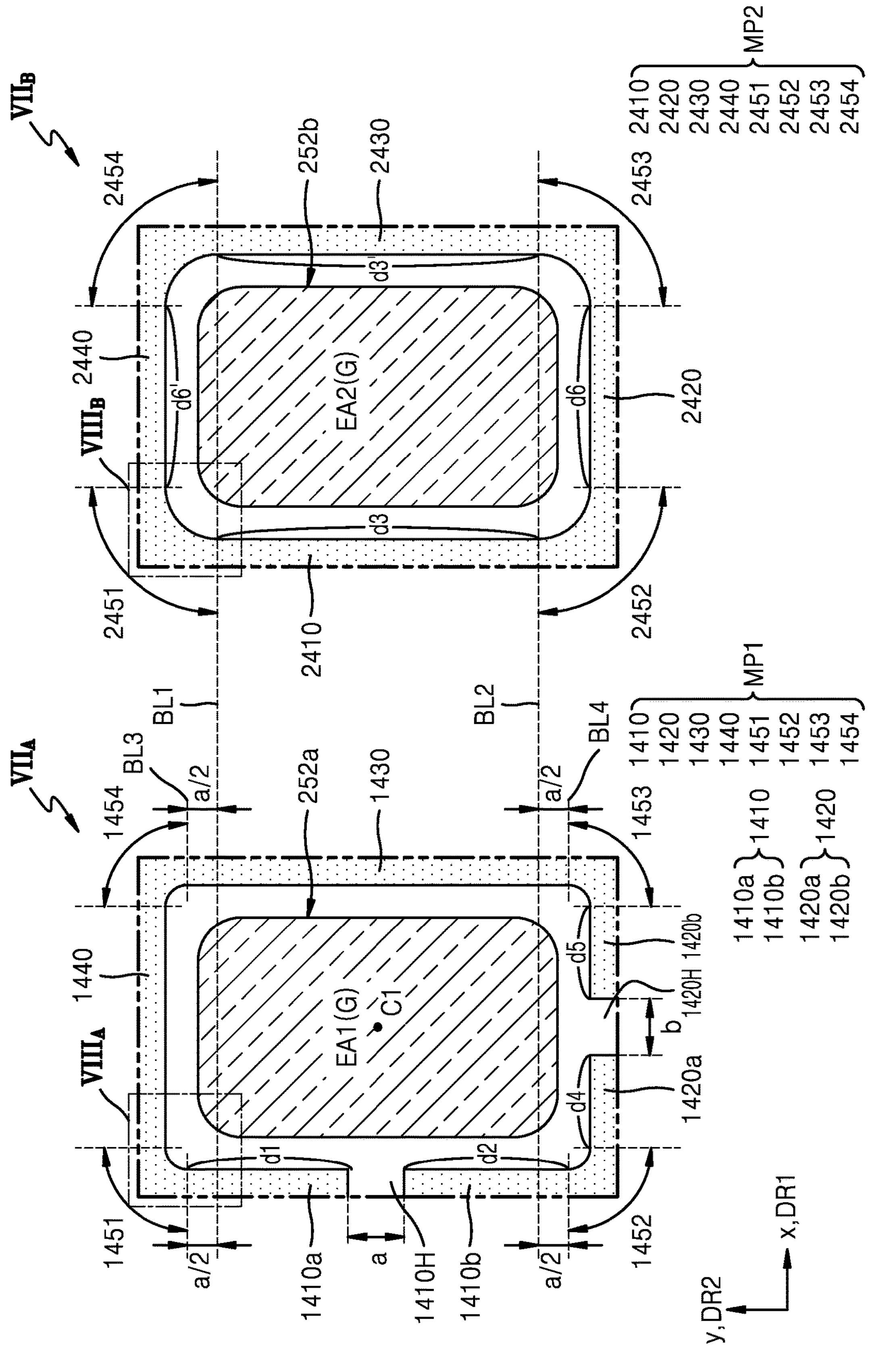
FIG. 7 is a plan view illustrating $VII_A$ and $VII_B$ of the display device in FIG. 5, according to some embodiments.
Figure 8A:
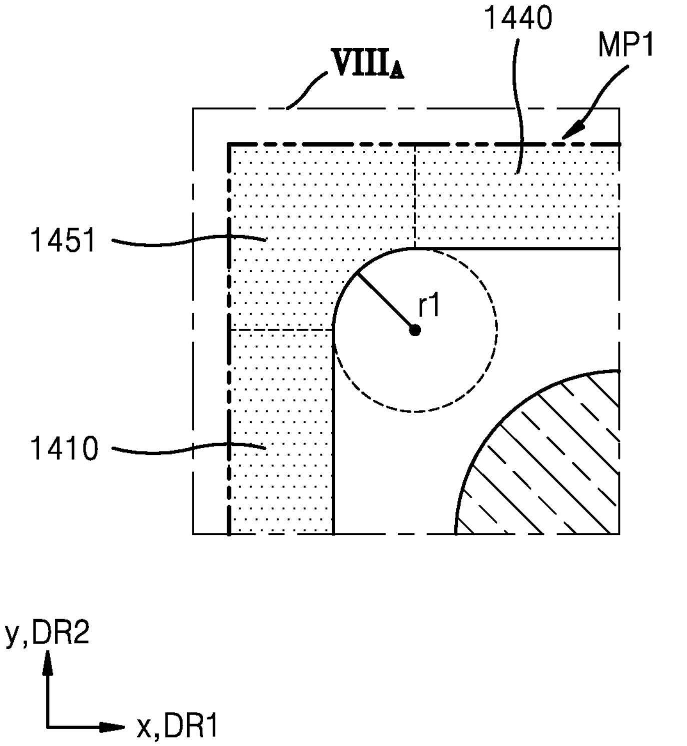
FIGS. 8A and 8B are respectively enlarged plan views illustrating $VIII_A$ and $VIII_B$ of the display device in FIG. 7, according to some embodiments.
Figure 8B:
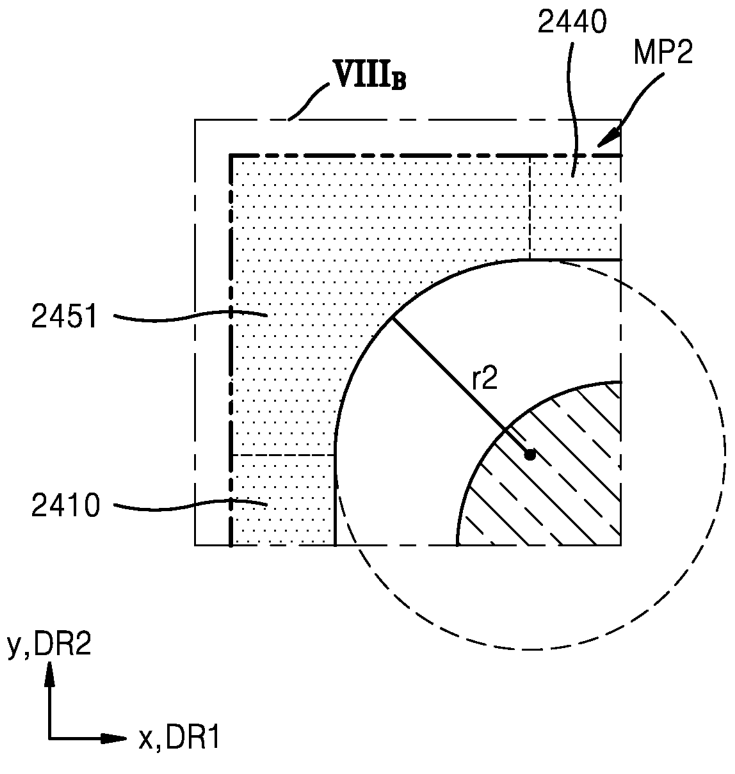
Figure 9A:
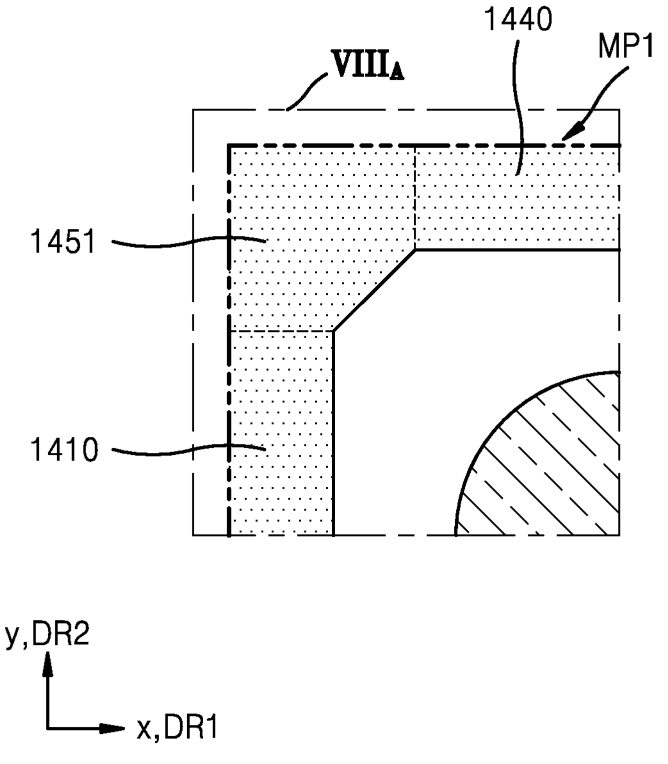
FIGS. 9A and 9B are respectively enlarged plan views illustrating $VIII_A$ and $VIII_B$ of the display device in FIG. 7, according to some embodiments.
Figure 9B:
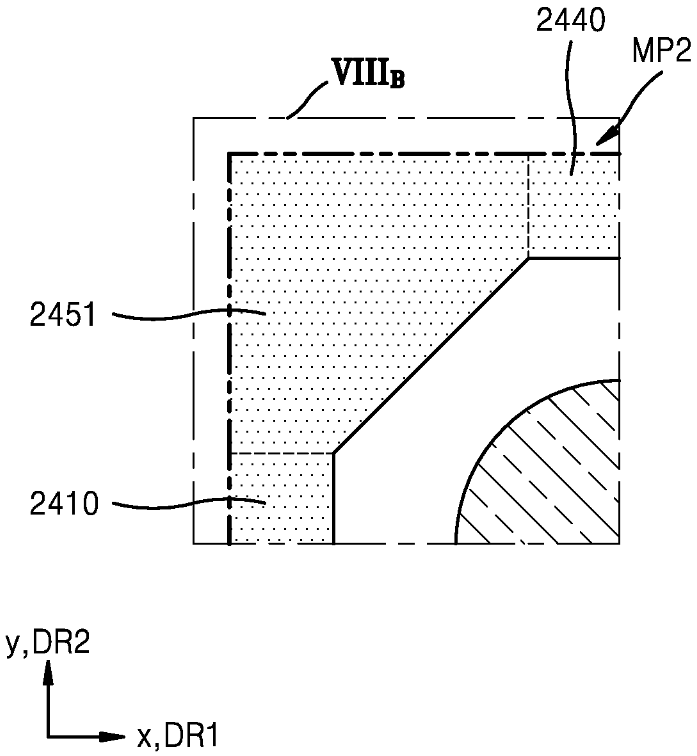

FIG. 7 is a plan view illustrating $VII_A$ and $VII_B$ of the display device 1 in FIG. 5, according to some embodiments, FIGS. 8A and 8B are respectively enlarged plan views illustrating $VIII_A$ and $VIII_B$ of the display device 1 in FIG. 7, according to some embodiments, and FIGS. 9A and 9B are respectively enlarged plan views illustrating $VIII_A$ and $VIII_B$ of the display device 1 in FIG. 7, according to some embodiments.

Referring to $VII_A$ and $VII_B$ of FIG. 7, emission areas EA1 and EA2 of light-emitting diodes 252*a* and 252*b* spaced apart from each other and configured to emit light of the same first color (e.g., green color) may be at least partially surrounded by a metal pattern adjacent to the emission areas EA1 and EA2.

For example, as illustrated in $VII_A$ of FIG. 7, an emission area (hereinafter referred to as a first emission area EA1) of a first light-emitting diode 252*a* emitting light of a first color may be at least partially surrounded by a portion of the metal pattern (hereinafter referred to as a first metal pattern MP1) in a plan view. As illustrated in $VII_B$ of FIG. 7, an emission area (hereinafter referred to as a second emission area EA2) of a second light-emitting diode 252*b* emitting light of a first color may be completely surrounded by a portion of the metal pattern (hereinafter referred to as a second metal pattern MP2) in a plan view.

Hereinafter, for convenience of description, it is assumed that the light of the first color is green light and the first emission area EA1 and the second emission area EA2 each correspond to the green sub-pixels G, but embodiments according to the present disclosure are not limited thereto. According to some embodiments, the first emission area EA1 and the second emission area EA2 emitting the light of the first color may each be a red sub-pixel or a blue sub-pixel.

The first metal pattern MP1 may include a first side portion 1410 adjacent to a first side of the first emission area EA1 of the first light-emitting diode 252*a*, a second side portion 1420 adjacent to a second side of the first emission area EA1 of the first light-emitting diode 252*a*, a third side portion 1430 adjacent to a third side of the first emission area EA1 of the first light-emitting diode 252*a*, and a fourth side portion 1440 adjacent to a fourth side of the first emission area EA1 of the first light-emitting diode 252*a*.

The first metal pattern MP1 may include corner portions 1451, 1452, 1453, and 1454 between two adjacent side portions among the first to fourth side portions 1410, 1420, 1430, and 1440. For example, the first metal pattern MP1 may include the corner portion 1451 between the first side portion 1410 and the fourth side portion 1440, the corner portion 1452 between the first side portion 1410 and the second side portion 1420, the corner portion 1453 between the second side portion 1420 and the third side portion 1430, and the corner portion 1454 between the third side portion 1430 and the fourth side portion 1440.

The first side portion 1410 and the third side portion 1430 of the first metal pattern MP1 may be located on opposite sides to each other with the first emission area EA1 therebetween, and the second side portion 1420 and the fourth side portion 1440 of the first metal pattern MP1 may be located on opposite sides to each other with the first emission area EA1 therebetween.

The first metal pattern MP1 may include an open portion provided at one side portion spaced apart from the first emission area EA1 in the first direction DR1 (e.g., ±x directions), and/or an open portion provided at a side portion spaced apart from the first emission area EA1 in the second direction DR2 (e.g., ±y directions). According to some embodiments, $VII_A$ of FIG. 7 illustrates that the first metal pattern MP1 includes a first open portion 1410H at the first side portion 1410 and a second open portion 1420H at the second side portion 1420. A length 'a' of the first open portion 1410H may be substantially equal to a length 'b' of the second open portion 1420H.

The second metal pattern MP2 may include a first side portion 2410 adjacent to a first side of the second emission area EA2 of the second light-emitting diode 252*b*, a second side portion 2420 adjacent to a second side of the second emission area EA2 of the second light-emitting diode 252*b*, a third side portion 2430 adjacent to a third side of the second emission area EA2 of the second light-emitting diode 252*b*, and a fourth side portion 2440 adjacent to a fourth side of the second emission area EA2 of the second light-emitting diode 252*b*.

The second metal pattern MP2 may include corner portions 2451, 2452, 2453, and 2454 between two adjacent side portions among the first to fourth side portions 2410, 2420, 2430, and 2440. For example, the second metal pattern MP2 may include the corner portion 2451 between the first side portion 2410 and the fourth side portion 2440, the corner portion 2452 between the first side portion 2410 and the second side portion 2420, the corner portion 2453 between the second side portion 2420 and the third side portion 2430, and the corner portion 2454 between the third side portion 2430 and the fourth side portion 2440.

The first side portion 2410 and the third side portion 2430 of the second metal pattern MP2 may be located on opposite sides to each other with the second emission area EA2 therebetween, and the second side portion 2420 and the fourth side portion 2440 of the second metal pattern MP2 may be located on opposite sides to each other with the second emission area EA2 therebetween.

Unlike the first metal pattern MP1, the second metal pattern MP2 may have a structure that completely surrounds the second emission area EA2 without including an open portion.

The first emission area EA1 and the second emission area EA2 emitting light of the same color may be arranged in the display area (DA of FIG. 5). In the display area DA, the first metal pattern MP1 around the first emission area EA1 includes the open portions (e.g., the first and second open portions 1410H and 1420H), but the second metal pattern MP2 around the second emission area EA2 does not include open portions. When light incident from the outside toward the display device is reflected from the first metal pattern MP1 and the second metal pattern MP2 due to the structural difference described above, the metal pattern (MP of FIG. 5) may be recognized by a user using the display device.

However, according to some embodiments, the above-described problem may be prevented or reduced when the effective length of the inner edge of the first side portion 1410 of the first metal pattern MP1 including the first open portion 1410H is made to be substantially equal to the effective length of the inner edge of the first side portion 2410 and/or the third side portion 2430 of the second metal pattern MP2 not including the open portion. The effective length of the inner edge of the side portion refers to the length of the side portion excluding the open portion. That is, the effective length of the inner edge of the first side portion 1410 of the first metal pattern MP1 is the length (d1+d2) of the inner edge of the first side portion 1410 excluding the first open portion 1410H. For example, the effective length of the inner edge of the first side portion 1410 of the first metal pattern MP1 is the sum (d1+d2) of the lengths of portions 1410*a* and 1410*b* of the first side portion 1410 arranged on both sides of the first open portion 1410H. Because the second metal pattern MP2 has no open portion, the effective length of the inner edge of the side portion is equal to the length of the inner edge of the side portion.

According to some embodiments, the above-described problem may be prevented, reduced, or minimized when the effective length (d1+d2) of the inner edge of the first side portion 1410 of the first metal pattern MP1 is made to be substantially equal to the effective length d3 of the inner edge of the first side portion 2410 of the second metal pattern MP2 and/or the effective length d3' of the inner edge of the third side portion 2430 of the second metal pattern MP2. In the case of having the structure described above, when the user views the display device in the first direction DR1 (e.g., +x directions), the amount of external light reflected from the first metal pattern MP1 is substantially equal to the amount of external light reflected from the second metal pattern MP2, and thus, it is difficult to distinguish the structural difference between the first metal pattern MP1 and the second metal pattern MP2 with the naked eye.

According to some embodiments, the above-described problems may be prevented or reduced when the effective length of the inner edge of the second side portion 1420 of the first metal pattern MP1 including the second open portion 1420H is made to be substantially equal to the effective length of the inner edge of the second side portion 2420 and/or the fourth side portion 2440 of the second metal pattern MP2 not including the open portion. The effective length of the inner edge of the second side portion 1420 of the first metal pattern MP1 is the length (d4+d5) of the inner edge of the second side portion 1420 excluding the second open portion 1420H. For example, the effective length of the inner edge of the second side portion 1420 of the first metal pattern MP1 is the sum (d4+d5) of the lengths of portions 1420*a* and 1420*b* of the second side portion 1420 arranged on both sides of the second open portion 1420H. Because the second metal pattern MP2 has no open portion, the effective length of the inner edge of the side portion is equal to the length of the inner edge of the side portion.

According to some embodiments, the above-described problem may be prevented, reduced, or minimized when the effective length (d4+d5) of the inner edge of the second side portion 1420 of the first metal pattern MP1 is made to be substantially equal to the effective length d6 of the inner edge of the second side portion 2420 of the second metal pattern MP2 and/or the effective length d6' of the inner edge of the fourth side portion 2440 of the second metal pattern MP2. In the case of having the structure described above, when the user views the display device in the second direction DR2 (e.g., ±y directions), the amount of external light reflected from the first metal pattern MP1 is substantially equal to the amount of external light reflected from the second metal pattern MP2, and thus, it is difficult to distinguish the structural difference between the first metal pattern MP1 and the second metal pattern MP2 with the naked eye.

The inner edge of each of the first to fourth side portions 1410, 1420, 1430, and 1440 of the first metal pattern MP1 is a straight line, and the inner edge of each of the first to fourth side portions 2410, 2420, 2430, and 2440 of the second metal pattern MP2 is a straight line.

$VII_A$ of FIG. 7 illustrates that, the first open portion 1410H is spaced apart from the center C1 of the first emission area EA1 in the first direction DR1 (e.g., +x directions), and the portions 1410*a* and 1410*b* on both sides of the first open portion 1410H have the same length (d1=d2), but embodiments according to the present disclosure are not limited thereto. For example, the portions 1410*a* and 1410*b* on both sides of the first open portion 1410H may have different lengths from each other. For example, "d1>d2" or "d1<d2" may be satisfied, but the aforementioned condition (d1+d2=d3 or d1+d2=d3') may be equally satisfied.

Similarly, $VII_A$ of FIG. 7 illustrates that, the second open portion 1420H is spaced apart from the center C1 of the first emission area EA1 in the second direction DR2 (e.g., ty directions), and the portions 1420*a* and 1420*b* on both sides of the second open portion 1420H have the same length (d4=d5), but embodiments according to the present disclosure are not limited thereto. For example, the portions 1420*a* and 1420*b* on both sides of the second open portion 1420H may have different lengths from each other. For example, "d4>d5" or "d4<d5" may be satisfied, but the aforementioned condition (d4+d5=d6 or d4+d5=d6') may be equally satisfied.

As illustrated in $VII_A$ and $VII_B$ of FIG. 7, when the first emission area EA1 and the second emission area EA2, which are spaced apart from each other and emit light of the same color, are extracted and placed on the same line, a boundary (e.g., a first boundary BL1 or a second boundary BL2) between the first side portion 2410 of the second metal pattern MP2 and the corner portion 2451 or 2452 connected to the first side portion 2410 is located on a line different from a boundary between the first side portion 1410 of the first metal pattern MP1 and the corner portion 1451 or 1452 connected to the first side portion 1410.

According to some embodiments, a third boundary BL3 between the first side portion 1410 of the first metal pattern MP1 and the corner portion 1451 arranged on one side of the first side portion 1410 may be spaced apart from the first boundary BL1 by a length of a/2. A fourth boundary BL4 between the first side portion 1410 and the corner portion 1452 arranged on the other side of the first side portion 1410 may be spaced apart from the second boundary BL2 by a length of a/2.

Similarly, when the first emission area EA1 and the second emission area EA2 are extracted and placed on the same line, a boundary between the third side portion 2430 of the second metal pattern MP2 and the corner portion 2453 or 2454 connected to the third side portion 2430 may be located on a line different from a boundary between the third side portion 1430 of the first metal pattern MP1 and the corner portion 1453 or 1454 connected to the third side portion 1430.

According to some embodiments, the third boundary BL3 between the third side portion 1430 of the first metal pattern MP1 and the corner portion 1454 arranged on one side of the third side portion 1430 may be spaced apart from the first boundary BL1 by a length of a/2. The fourth boundary BL4 between the third side portion 1430 and the corner portion 1453 arranged on the other side of the third side portion 1430 may be spaced apart from the second boundary BL2 by a length of a/2.

Although FIG. 7 illustrates a case where the first emission area EA1 and the second emission area EA2 are extracted and placed on the same line in the first direction DR1 (e.g., +x directions), embodiments according to the present disclosure are not limited thereto. Similarly, when the first emission area EA1 and the second emission area EA2 are extracted and placed on the same line in the second direction DR2 (e.g., ty directions), a boundary between the second side portion 2420 of the second metal pattern MP2 and the corner portion 2452 or 2453 connected to the second side portion 2420 may be located on a line different from a boundary between the second side portion 1420 of the first metal pattern MP1 and the corner portion 1452 or 1453 connected to the second side portion 1420. A boundary between the fourth side portion 2440 of the second metal pattern MP2 and the corner portion 2451 or 2454 connected to the fourth side portion 2440 may be located on a line different from a boundary between the fourth side portion 1440 of the first metal pattern MP1 and the corner portion 1451 or 1454 connected to the fourth side portion 1440.

The boundary between the side portion and the corner portion may be defined as a point where the shape of the inner edge of the side portion and the shape of the inner edge of the corner portion change. For example, as illustrated in FIG. 8A, the shape of the inner edge of the corner portion 1451 of the first metal pattern MP1 is different from the shape of the inner edges of the side portions on both sides of the corner portion 1451, for example, the first side portion 1410 and the fourth side portion 1440. That is, the inner edge of the corner portion 1451 of the first metal pattern MP1 has a curved shape, and the inner edges of the side portions on both sides of the corner portion 1451, for example, the first side portion 1410 and the fourth side portion 1440 each have a straight-line shape. Similarly, as illustrated in FIG. 8B, the shape of the inner edge of the corner portion 2451 of the second metal pattern MP2 is different from the shape of the inner edges of the side portions on both sides of the corner portion 2451, for example, the first side portion 2410 and the fourth side portion 2440. That is, the inner edge of the corner portion 2451 of the second metal pattern MP2 has a curved shape, and the inner edges of the side portions on both sides of the corner portion 2451, for example, the first side portion 2410 and the fourth side portion 2440 each have a straight-line shape.

Referring to FIGS. 8A and 8B, the length of the inner edge of the corner portion 1451 of the first metal pattern MP1 may be different from the length of the inner edge of the corner portion 2451 of the second metal pattern MP2. The length (e.g., curve length) of the corner portion 1451 of the first metal pattern MP1 may be less than the length (e.g., curve length) of the corner portion 2451 of the second metal pattern MP2. A radius r1 of curvature of the corner portion 1451 of the first metal pattern MP1 may be less than a radius r2 of curvature of the corner portion 2451 of the second metal pattern MP2.

FIGS. 8A and 8B illustrate that the corner portion 1451 of the first metal pattern MP1 and the corner portion 2451 of the second metal pattern MP2 each have a round shape having a radius of curvature, but embodiments according to the present disclosure are not limited thereto.

As illustrated in FIGS. 9A and 9B, the corner portion 1451 of the first metal pattern MP1 and the corner portion 2451 of the second metal pattern MP2 may each have a chamfered shape. For example, the corner portion 1451 of the first metal pattern MP1 and the corner portion 2451 of the second metal pattern MP2 may each be a straight line.

As illustrated in FIG. 9A, the inner edge of the corner portion 1451 of the first metal pattern MP1 is a straight line, like the inner edges of the side portions on both sides of the corner portion 1451, for example, the first side portion 1410 and the fourth side portion 1440. A bent point may be located between the straight line of the inner edge of the corner portion 1451 and the straight line of the inner edge of the first side portion 1410 or the fourth side portion 1440, and the bent point may correspond to the boundary between the side portion and the corner portion. In other words, the straight line of the inner edge of the first side portion 1410 may be bent at the boundary between the first side portion 1410 and the corner portion 1451, and the shape of the straight line may be changed by the bending.

As illustrated in FIG. 9B, the inner edge of the corner portion 2451 of the second metal pattern MP2 is straight, like the inner edges of the side portions on both sides of the corner portion 2451, for example, the first side portion 2410 and the fourth side portion 2440. A bent point may be located between the straight line of the inner edge of the corner portion 2451 and the straight line of the inner edge of the first side portion 2410 or the fourth side portion 2440, and the bent point may correspond to the boundary between the side portion and the corner portion. In other words, the straight line of the inner edge of the first side portion 2410 may be bent at the boundary between the first side portion 2410 and the corner portion 2451, and the shape of the straight line may be changed by the bending.

As illustrated in FIGS. 9A and 9B, the length of the inner edge of the corner portion 1451 of the first metal pattern MP1 may be different from the length of the inner edge of the corner portion 2451 of the second metal pattern MP2. For example, the length (e.g., straight-line length) of the corner portion 1451 of the first metal pattern MP1 may be less than the length (e.g., straight-line length) of the corner portion 2451 of the second metal pattern MP2.

Figure 10:
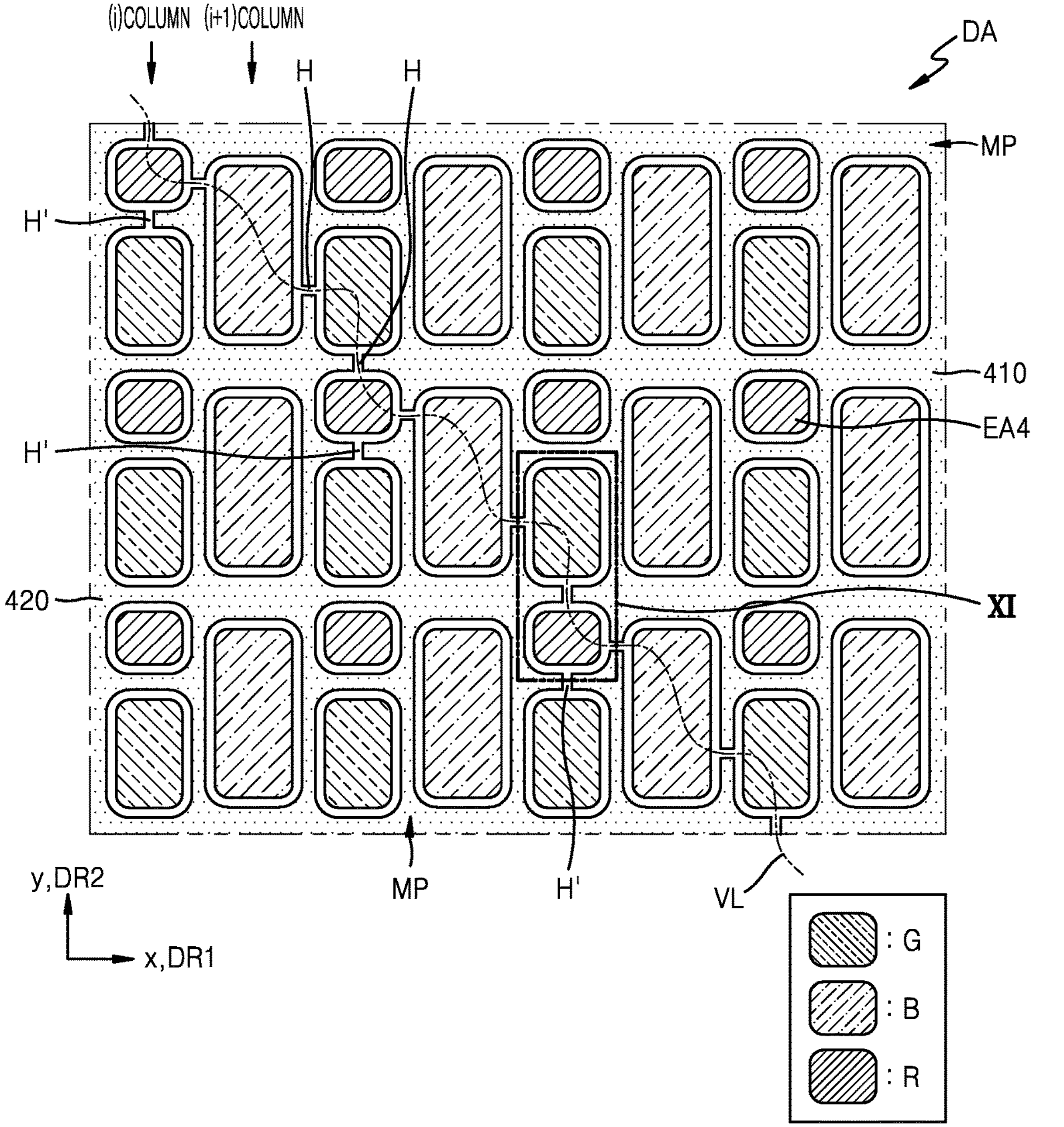
FIG. 10 is an enlarged plan view illustrating a portion of a display area of a display device, according to some embodiments.

FIG. 10 is an enlarged plan view illustrating a portion of the display area of the display device, according to some embodiments, and FIG. 10 is the same as FIG. 5.

Referring to FIG. 10, the metal pattern MP may include open portions H and H' extending in the first direction DR1 (e.g., +x directions) and the second direction DR2 (e.g., ty directions) around emission areas corresponding to some sub-pixels among red, green, and blue sub-pixels R, G, and B, as described above with reference to FIGS. 5 and 7. The open portions H and H' of FIG. 10 are substantially the same as the first open portion 1410H and the second open portion 1420H described above with reference to $VII_A$ of FIG. 7.

Some open portions H may be connected to form a virtual line VL illustrated in FIG. 10. According to some embodiments, the virtual line VL may be a separation space between the first sensing electrode 410 and the second sensing electrode 420 and the first sensing electrode 410 and the second sensing electrode 420 may have different voltage levels or signal levels based on the virtual line VL. In other words, the metal pattern MP may include at least two portions physically and electrically separated from each other with respect to the virtual line VL. According to some embodiments, FIG. 10 illustrates that at least the two portions separated from each other with respect to the virtual line VL are the first sensing electrode 410 and the second sensing electrode 420.

The metal pattern MP may include an open portion (or a dummy open portion) H' that is not located on the virtual line VL. A portion of the metal pattern MP including the open portion H' may have the same structure and characteristics as those of the first metal pattern MP1 including the first open portion 1410H and/or the second open portion 1420H described above with reference to $VII_A$ of FIG. 7A, and may minimize, reduce, or prevent or reduce the recognition of (or instances of users perceiving) the metal pattern MP due to the reflection of external light.

Figure 11:
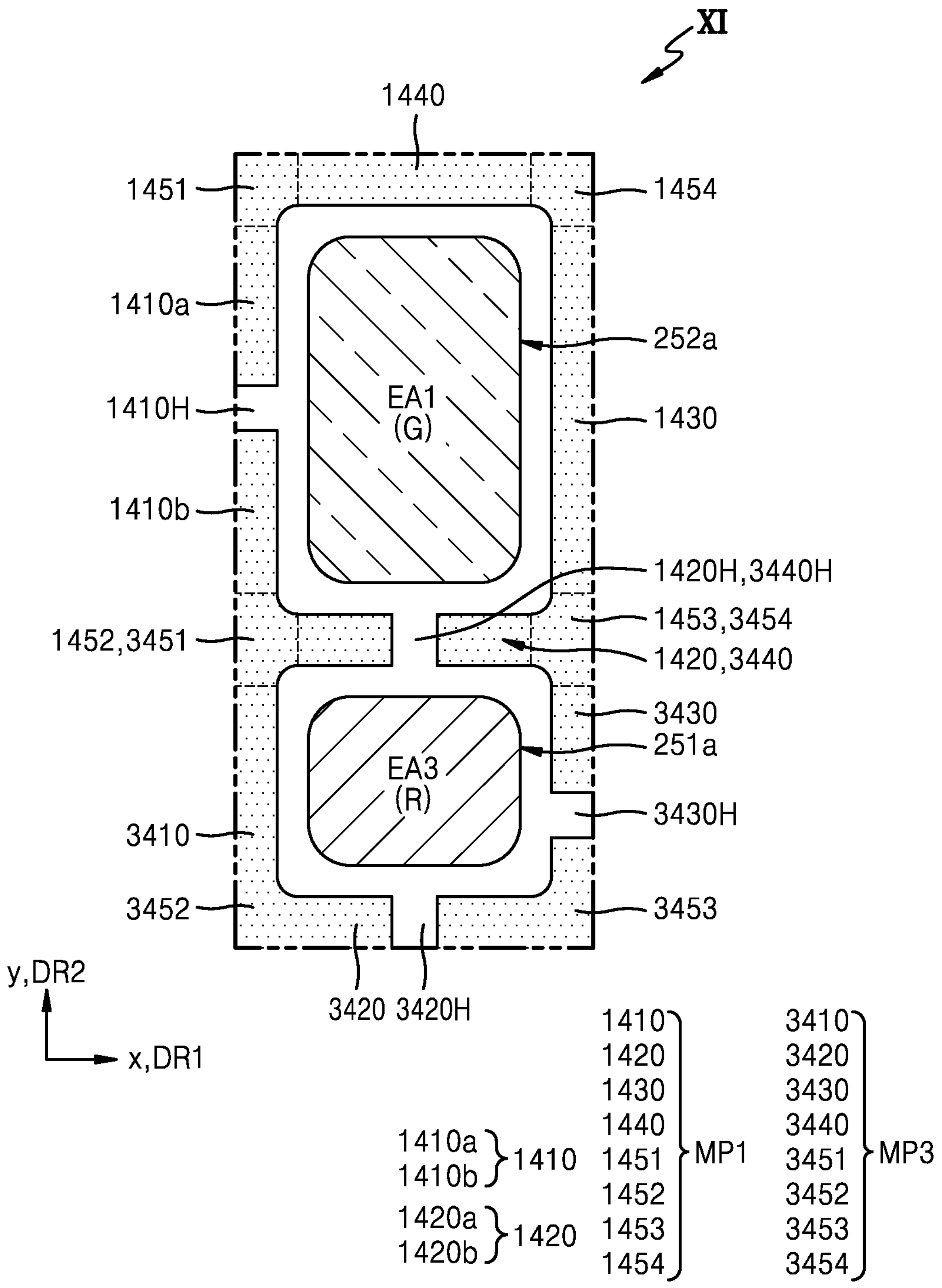
FIG. 11 is a plan view illustrating a portion XI of the display device in FIG. 10, according to some embodiments.

FIG. 11 is a plan view illustrating a portion XI of the display device in FIG. 10, according to some embodiments. In other words, FIG. 11 illustrates metal patterns that are arranged adjacent to each other around sub-pixels emitting different pieces of light in FIG. 10.

Referring to FIG. 11, light-emitting diodes arranged adjacent to each other and emitting pieces of light of different colors, for example, a light-emitting diode **252*a* emitting light of a first color (e.g., green) and a light-emitting diode 251*a*** emitting light of a second color (e.g., red) may be partially surrounded by metal patterns around emission areas thereof.

For example, the first emission area EA1 of the first light-emitting diode 252a emitting light of the first color may be partially surrounded by a first metal pattern MP1 in a plan view, and the emission area (hereinafter referred to as a third emission area EA3) of the third light-emitting diode 251a emitting light of the second color may be completely surrounded by a portion of a metal pattern (hereinafter referred to as a third metal pattern MP3) in a plan view.

The first metal pattern MP1 is the same as described above with reference to FIG. 7. The first metal pattern MP1 may include a first open portion 1410H and a second open portion 1420H respectively arranged in the first direction DR1 (e.g., +x directions) and the second direction DR2 (e.g., ty directions) with respect to the first emission area EA1. The first open portion 1410H and the second open portion 1420H correspond to the open portions H located on the virtual line VL described above with reference to FIG. 10.

The third metal pattern MP3 may include a first side portion 3410 adjacent to a first side of the third emission area EA3 of the third light-emitting diode 251a, a second side portion 3420 adjacent to a second side of the third emission area EA3 of the third light-emitting diode 251a, a third side portion 3430 adjacent to a third side of the third emission area EA3 of the third light-emitting diode 251a, and a fourth side portion 3440 adjacent to a fourth side of the third emission area EA3 of the third light-emitting diode 251a. The fourth side portion 3440 of the third metal pattern MP3 may be the second side portion 1420 of the first metal pattern MP1. In other words, the third metal pattern MP3 and the first metal pattern MP1 may share the side portion, and the fifth open portion 3440H provided on the fourth side portion 3440 of the third metal pattern MP3 may correspond to the second open portion 1420H of the first metal pattern MP1.

The third metal pattern MP3 may include corner portions 3451, 3452, 3453, and 3454 between two adjacent side portions among the first to fourth side portions 3410, 3420, 3430, and 3440. For example, the third metal pattern MP3 may include the corner portion 3451 between the first side portion 3410 and the fourth side portion 3440, the corner portion 3452 between the first side portion 3410 and the second side portion 3420, the corner portion 3453 between the second side portion 3420 and the third side portion 3430, and the corner portion 3454 between the third side portion 3430 and the fourth side portion 3440. Some corner portions 3451 and 3454 of the third metal pattern MP3 may be some corner portions 1452 and 1453 of the first metal pattern MP1. In other words, the third metal pattern MP3 and the first metal pattern MP1 may share some corner portions.

In order to minimize or reduce the recognition of (or instances of users perceiving) the reflection of external light incident in the first direction DR1 (e.g., +x directions) and the second direction DR2 (e.g., ty directions), the first open portion 1410H and the second open portion 1420H of the first metal pattern MP1 may have the same structure as described above with reference to FIG. 7.

In order to minimize or reduce the recognition of (or instances of users perceiving) the reflection of external light incident in the first direction DR1 (e.g., +x directions) and the second direction DR2 (e.g., ty directions), the third metal pattern MP3 may include open portions, for example, a third open portion 3420H and a fourth open portion 3430H. The third open portion 3420H may be provided on the second side portion 3420 and the fourth open portion 3430H may be provided on the third side portion 3430.

The third metal pattern MP3 may have the same structure as that of the first metal pattern MP1 described above with reference to FIG. 7. Another emission area (see EA4 in FIG. 10, hereinafter referred to as fourth emission are EA4), which emits light of the same color as the third emission area EA3 and is completely surrounded by the metal pattern, may be spaced apart from the third emission area EA3. The length (effective length) of the inner edge of one side portion of the metal pattern around the fourth emission area (see EA4 in FIG. 10) may be equal to the effective length of the side portion of the third metal pattern MP3 including the third open portion 3420H or the fourth open portion 3430H. Also, the length of the inner edge of the corner portion of the metal pattern around the fourth emission area (see EA4 in FIG. 10) may be different from the length of the inner edge of each of the corner portions 3451, 3452, 3453, and 3454 of the third metal pattern MP3.

Figure 12:
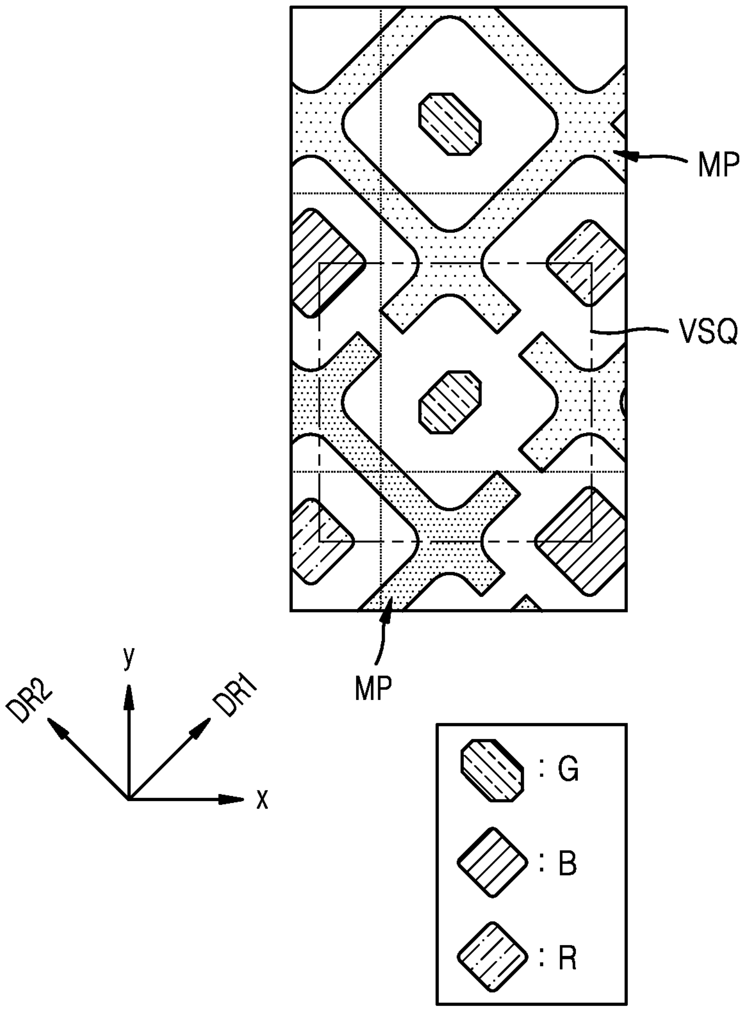
FIG. 12 is an enlarged plan view illustrating a portion of a display area of a display device, according to some embodiments.

FIG. 12 is an enlarged plan view illustrating a portion of a display area of a display device, according to some embodiments.

According to some embodiments as described above with reference to FIGS. 5 to 11, the metal pattern MP around the sub-pixels having a structure in which the first column in which the red sub-pixels R and the green sub-pixels G are alternately arranged and the second column in which the blue sub-pixels B are spaced apart from each other are repeated has been described, but embodiments are not limited thereto.

According to some embodiments, as illustrated in FIG. 11, red, green, and blue sub-pixels R, G, and B may have a PenTile® structure, for example, a diamond PenTile® structure. The metal pattern MP around the sub-pixels having the diamond PenTile® structure may also have the same characteristics as described above with reference to FIGS. 5 to 11, and the description provided above is equally applied thereto.

The diamond PenTile® structure may be expressed as follows: in a virtual square VSQ having the center point of the green sub-pixel G as the center point of the virtual square VSQ, the red sub-pixels R are arranged at the first and third vertices of the virtual square VSQ located in the diagonal direction, and the blue sub-pixels B are arranged at the second and fourth vertices of the virtual square VSQ.

According to some embodiments as described above with reference to FIGS. 3 to 11, the metal pattern of the input sensing layer includes mutual capacitance-type sensing electrodes, but embodiments according to the present disclosure are not limited thereto. According to some embodiments, the metal pattern may include self-capacitance-type sensing electrodes.

According to some embodiments, by varying the lengths of the side portions or the shapes of the corner portions of the metal patterns around different sub-pixels, it may be possible to prevent or reduce instances of the metal pattern of the input sensing layer being unintentionally recognized or perceived due to the reflection of external light. The characteristics described above are illustrative, and the characteristics of embodiments according to the present disclosure are not limited to those described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:

light-emitting diodes;

an encapsulation layer on the light-emitting diodes; and an input sensing layer on the encapsulation layer, the input sensing layer comprising a metal pattern at least partially surrounding each of the light-emitting diodes in a plan view, wherein a first metal pattern partially surrounding an emission area of a first light-emitting diode emitting light of a first color among the light-emitting diodes comprises:

a first side portion adjacent to a first side of the emission area of the first light-emitting diode, the first side portion comprising a first open portion extending from the first side in a first direction;

a second side portion adjacent to a second side of the emission area of the first light-emitting diode, the second side portion comprising a second open portion extending from the second side of the first light-emitting diode in a second direction crossing the first direction; and corner portions on opposite sides of the first side portion with the first open portion therebetween, a second metal pattern completely surrounding an emission area of a second light-emitting diode emitting light of the first color among the light-emitting diodes comprises:

a first side portion adjacent to a first side of the emission area of the second light-emitting diode;

a second side portion adjacent to a second side of the emission area of the second light-emitting diode;

a third side portion on an opposite side of the first side of the emission area of the second light-emitting diode with the emission area of the second light-emitting diode therebetween; and corner portions on both sides of the first side portion of the second metal pattern or on both sides of the second side portion of the second metal pattern, and an effective length of an inner edge of the first side portion of the first metal pattern excluding the first open portion is equal to an effective length of an inner edge of the first side portion of the second metal pattern or an effective length of an inner edge of the third side portion of the second metal pattern.

2. The display device of claim 1, wherein a length of an inner edge of each of the corner portions of the first metal pattern is different from a length of an inner edge of each of the corner portions of the second metal pattern.

3. The display device of claim 2, wherein the inner edge of each of the corner portions of the first metal pattern and the inner edge of each of the corner portions of the second metal pattern have a round shape in a plan view.

4. The display device of claim 3, wherein a radius of curvature of the inner edge of each of the corner portions of the first metal pattern is less than a radius of curvature of the inner edge of each of the corner portions of the second metal pattern.

5. The display device of claim 2, wherein the inner edge of each of the corner portions of the first metal pattern and the inner edge of each of the corner portions of the second metal pattern have a chamfered shape in a plan view.

6. The display device of claim 1, wherein the metal pattern comprises at least one of molybdenum (Mo), silver (Ag), titanium (Ti), copper (Cu), or aluminum (Al).

7. The display device of claim 1, wherein a length of the first open portion is equal to a length of the second open portion.

8. The display device of claim 1, wherein a third metal pattern partially surrounding a third light-emitting diode which is adjacent to the first light-emitting diode and emits light of a color different from the first color comprises:

a first side portion adjacent to a first side of an emission area of the third light-emitting diode;

a second side portion adjacent to a second side of the emission area of the third light-emitting diode;

a third side portion on an opposite side of the first side portion of the third metal pattern with the emission area of the third light-emitting diode therebetween; and a fourth side portion on an opposite side of the second side portion of the third metal pattern with the emission area of the third light-emitting diode therebetween, the fourth side portion of the third metal pattern is the second side portion of the first metal pattern, and the second side portion of the third metal pattern and one of the first side portion and the third side portion of the third metal pattern each comprise an open portion.

9. The display device of claim 8, wherein a length of the open portion is equal to a length of the first open portion or the second open portion.

10. A display device comprising:

an array of sub-pixels comprising red sub-pixels, green sub-pixels, and blue sub-pixels; and an input sensing layer comprising a metal pattern at least partially surrounding each of the sub-pixels in a plan view, wherein the array has a structure in which an $i^{th}$ column (where i is a natural number), in which the red sub-pixels and the green sub-pixels are alternately arranged, and an $(i+1)^{th}$ column, in which the blue sub-pixels are arranged, are alternately arranged, the metal pattern comprises a first metal pattern partially surrounding a first sub-pixel, which is one of the sub-pixels, and a second metal pattern completely surrounding a second sub-pixel emitting light of a same color as the first sub-pixel, and the first metal pattern comprises a first open portion extending from the first sub-pixel in a first direction and a second open portion extending from the first sub-pixel in a second direction crossing the first direction, wherein the first metal pattern comprises:

a first side portion adjacent to a first side of the first sub-pixel, the first side portion comprising the first open portion;

a second side portion adjacent to a second side of the first sub-pixel, the second side portion comprising the second open portion; and corner portions on both sides of the first side portion with the first open portion therebetween, the second metal pattern comprises:

a first side portion adjacent to a first side of the second sub-pixel;

a second side portion adjacent to a second side of the second sub-pixel;

a third side portion on an opposite side of the first side portion of the second metal pattern with the second sub-pixel therebetween; and corner portions on both sides of the first side portion of the second metal pattern or on both sides of the second side portion of the second metal pattern, wherein a length of an inner edge of each of the corner portions of the first metal pattern is different from a length of an inner edge of each of the corner portions of the second metal pattern.

11. The display device of claim 10, wherein a length of the first open portion is equal to a length of the second open portion.

12. The display device of claim 11, wherein the metal pattern comprises at least one of molybdenum (Mo), silver (Ag), titanium (Ti), copper (Cu), or aluminum (Al).

13. The display device of claim 10, wherein an effective length of an inner edge of the first side portion of the first metal pattern excluding the first open portion is equal to an effective length of an inner edge of the first side portion of the second metal pattern or an effective length of an inner edge of the third side portion of the second metal pattern.

14. The display device of claim 10, wherein the inner edge of each of the corner portions of the first metal pattern and the inner edge of each of the corner portions of the second metal pattern have a round shape in a plan view.

15. The display device of claim 14, wherein a radius of curvature of the inner edge of each of the corner portions of the first metal pattern is less than a radius of curvature of the inner edge of each of the corner portions of the second metal pattern.

16. The display device of claim 10, wherein the inner edge of each of the corner portions of the first metal pattern and the inner edge of each of the corner portions of the second metal pattern have a chamfered shape in a plan view.

17. The display device of claim 10, wherein a third metal pattern partially surrounding a third sub-pixel which is adjacent to the first sub-pixel and emits light of a color different from the first sub-pixel comprises:

a first side portion adjacent to a first side of the third sub-pixel;

a second side portion adjacent to a second side of the third sub-pixel;

a third side portion on an opposite side of the first side portion of the third metal pattern with the third sub-pixel therebetween; and a fourth side portion on an opposite side of the second side portion of the third metal pattern with the third sub-pixel therebetween, the fourth side portion of the third metal pattern is the second side portion of the first metal pattern, and the second side portion of the third metal pattern and one of the first side portion and the third side portion of the third metal pattern each comprise an open portion.

18. The display device of claim 17, wherein a length of the open portion is equal to a length of the first open portion or the second open portion.

* * * * *